(12) United States Patent
Huo

(10) Patent No.: US 10,241,602 B2
(45) Date of Patent: Mar. 26, 2019

(54) DISPLAY PANEL AND DISPLAY DEVICE

(71) Applicants: Shanghai Tianma Micro-electronics Co., Ltd., Shanghai (CN); Tianma Micro-electronics Co., Ltd., Shenzhen (CN)

(72) Inventor: Sitao Huo, Shanghai (CN)

(73) Assignees: Shanghai Tianma Micro-electronics Co., Ltd., Shanghai (CN); Tianma Micro-electronics Co., Ltd., Shenzhen (CN)

( * ) Notice: Subject to any disclaimer, the term of this patent is extended or adjusted under 35 U.S.C. 154(b) by 0 days.

(21) Appl. No.: 15/090,660

(22) Filed: Apr. 5, 2016

(65) Prior Publication Data

US 2017/0160847 A1 Jun. 8, 2017

(30) Foreign Application Priority Data

Dec. 4, 2015 (CN) .......................... 2015 1 0887569

(51) Int. Cl.
| | | |
|---|---|---|
| *G06F 3/045* | (2006.01) | |
| *G06F 3/041* | (2006.01) | |
| *G06F 3/044* | (2006.01) | |
| *H01L 27/32* | (2006.01) | |
| *H01L 51/52* | (2006.01) | |

(52) U.S. Cl.
CPC ............ *G06F 3/0412* (2013.01); *G06F 3/044* (2013.01); *G06F 3/0416* (2013.01); *H01L 27/323* (2013.01); *H01L 51/5256* (2013.01)

(58) Field of Classification Search
CPC ...... G06F 3/0412; G06F 3/044; G06F 3/0416; H01L 51/5256; H01L 27/323
See application file for complete search history.

(56) References Cited

U.S. PATENT DOCUMENTS

| | | | |
|---|---|---|---|
| 2012/0057312 A1* | 3/2012 | Yoo ......................... | G06F 3/041 361/749 |
| 2013/0037804 A1 | 2/2013 | Lee et al. | |
| 2013/0215049 A1* | 8/2013 | Lee ......................... | G06F 3/0416 345/173 |
| 2014/0204291 A1* | 7/2014 | Kung ....................... | G06F 3/041 349/12 |
| 2015/0309661 A1* | 10/2015 | Kim ......................... | G06F 3/044 345/174 |

(Continued)

FOREIGN PATENT DOCUMENTS

| | | |
|---|---|---|
| CN | 103545455 A | 1/2014 |
| CN | 103594483 A | 2/2014 |

(Continued)

*Primary Examiner* — Nelson M Rosario
*Assistant Examiner* — Andrew Lee
(74) *Attorney, Agent, or Firm* — Anova Law Group, PLLC

(57) ABSTRACT

A display panel and a display device are provided. The display panel comprises a substrate, a display element, a touch electrode layer, a plurality of touch signal lines, and a first barrier layer. The display element, the touch electrode layer and the plurality of touch signal lines are disposed on the substrate, and the touch electrode layer and the touch signal lines are disposed in a same layer. The first barrier layer is disposed between the display element and the touch electrode layer, and includes at least one organic film and at least one inorganic film alternately arranged.

19 Claims, 3 Drawing Sheets

(56) References Cited

U.S. PATENT DOCUMENTS

| | | | |
|---|---|---|---|
| 2016/0026284 A1* | 1/2016 | Wang | G06F 3/044 345/174 |
| 2016/0092027 A1* | 3/2016 | Lee | G06F 3/044 345/174 |
| 2016/0254479 A1* | 9/2016 | Jeong | H01L 51/5256 257/40 |
| 2016/0378240 A1* | 12/2016 | Li | G06F 3/0412 345/174 |
| 2017/0090673 A1* | 3/2017 | Kim | G06F 3/044 |
| 2017/0139534 A1* | 5/2017 | Hao | G06F 3/044 |

FOREIGN PATENT DOCUMENTS

| | | | | |
|---|---|---|---|---|
| CN | 104750285 A | 7/2015 | | |
| CN | 104808375 A | 7/2015 | | |
| WO | WO 2016123946 A1 * | 8/2016 | | G06F 3/0412 |
| WO | WO 2016201727 A1 * | 12/2016 | | G02F 1/1333 |

* cited by examiner

DISPLAY PANEL AND DISPLAY DEVICE

CROSS-REFERENCES TO RELATED APPLICATIONS

This application claims priority of Chinese Patent Application No. 201510887569.9, filed on Dec. 4, 2015, the entire contents of which are hereby incorporated by reference.

FIELD OF THE INVENTION

The present disclosure generally relates to the field of touch display technology and, more particularly, relates to a display panel and a display device including the display panel.

BACKGROUND

With the development of display technology, touch panels have been widely used in many fields and industries of modern societies. According to operational principles, touch panels may be classified into various categories, such as capacitive touch panels, resistive touch panels, infrared optical imaging touch panels, and electromagnetic induction touch panels, etc. In particular, capacitive touch panels are often classified into two categories: touch panels based on self-capacitance and touch panels based on mutual-capacitance.

On the other hand, organic light-emitting diode (OLED) displays have a lower power consumption than conventional liquid crystal displays (LCDs) because of the self-illumination. In addition, OLED displays also exhibit high light transmittance and fast response, thus have been extensively researched in the display field.

Currently, touch panels and OLED displays are often integrated through On-Cell technology (i.e., touch electrodes are built on the outer glass of the OLED display), and one glass solution (OGS) technology, etc., in which the corresponding structures and technologies are relatively mature. However, the current integration technologies may have certain issues, for example, complicated structures, multiple parts, large thickness, high cost, low production yield, poor moisture and oxygen barrier properties, and poor flexibility, etc.

The disclosed display panel and display device are directed to solve one or more problems set forth above and other problems.

BRIEF SUMMARY OF THE DISCLOSURE

One aspect of the present disclosure provides a display panel. The display panel comprises a substrate, a display element, a touch electrode layer, a plurality of touch signal lines, and a first barrier layer. The display element, the touch electrode layer and the plurality of touch signal lines are disposed on the substrate, and the touch electrode layer and the touch signal lines are disposed in a same layer. The first barrier layer is disposed between the display element and the touch electrode layer, and includes at least one organic film and at least one inorganic film alternately arranged.

Another aspect of the present disclosure provides a display device comprising a display panel. The display panel comprises a substrate, a display element, a touch electrode layer, a plurality of touch signal lines, and a first barrier layer. The display element, the touch electrode layer and the plurality of touch signal lines are disposed on the substrate, and the touch electrode layer and the touch signal lines are disposed in a same layer. The first barrier layer is disposed between the display element and the touch electrode layer, and includes at least one organic film and at least one inorganic film alternately arranged.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined or separated under conditions without conflicts.

The present disclosure provides an improved display panel and an improved display device containing the display panel. The disclosed display panel exhibits advantages such as simple fabrication, small thickness, in-cell touch, good flexibility, excellent moisture and oxygen barrier properties, etc.

Figure 1:
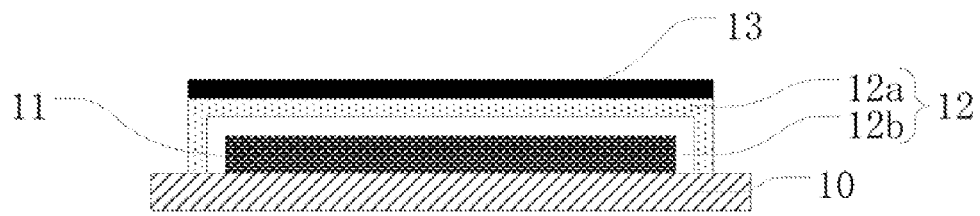
FIG. 1 illustrates a cross-sectional view of an exemplary display panel consistent with disclosed embodiments.

FIG. 1 illustrates a cross-sectional view of an exemplary display panel consistent with disclosed embodiments. As shown in FIG. 1, the display panel may include a substrate 10, a display element 11, a first barrier layer 12, a touch electrode layer 13, and a plurality of touch signal lines (not drawn in FIG. 1). In particular, the display element 11 may be disposed on the substrate 10, the touch electrode layer 13 and the touch signal lines may be disposed in a same layer, and the first barrier layer 12 may be disposed between the touch electrode layer 13 (touch signal lines) and the display element 11. The first barrier layer 12 may include at least one organic film 12a and at least one inorganic film 12b, in which the organic film 12a and the inorganic film 12b may be alternately arranged.

The display element 11 often requires a protection from moisture and oxygen penetration in electronic device, otherwise the performance, stability and durability of the display element 11 may be affected. In the disclosed embodiments, the display element 11 may be encapsulated by the first barrier layer 12, in which the organic film 12a and the inorganic film 12b may be alternately arranged. Such a thin-film-encapsulation (TFE) may exhibit a simple structure, low moisture and oxygen permeability.

Inorganic films often have excellent moisture and oxygen barrier properties, but are substantially rigid. Organic films have poorer moisture and oxygen barrier properties than inorganic films, but are able to eliminate the stress generated by inorganic film. Thus, alternately arranging the organic film 12a and the inorganic film 12b may provide excellent moisture and oxygen barrier properties in the first barrier layer 12 and, meanwhile, minimize the stress of the first barrier layer 12. Accordingly, the display element 11 may be less affected by the moisture, oxygen, stress, etc.

The numbers of layers of the organic films 12a and the inorganic films 12b in the first barrier layer 12 may be determined by predetermined algorithms. The predetermined algorithms may be designed according to various requirements of the moisture and oxygen barrier properties, flexibility, light transmittance, etc. In one embodiment, as shown in FIG. 1, the first barrier layer 12 may include one organic film 12a and one inorganic film 12b.

The touch electrode layer 13 may include a plurality of touch electrodes, and may have a single-layer touch structure, i.e., the touch electrode layer 13 and the touch signal lines may be disposed in a same layer. Compared to a display panel with a double-layer touch structure (i.e. the touch electrode layer and the touch signal lines are disposed in different layers), forming via for interconnecting the touch electrodes as well as interconnecting the touch electrodes and the touch signal lines may not be required in the display panel with the single-layer touch structure. Thus, each organic films and each inorganic film in the first barrier layer 12 may be tightly laminated without destroying the film integrity, which may successfully enable the touch function in the display panel without affecting the moisture and oxygen barrier properties of the first barrier layer 12.

Further, compared to a display panel with the double-layer touch structure, the display panel with the single-layer touch structure may be thinner and lighter, and display electrodes in the display element 11 (i.e., electrodes used for displaying images) may not be multiplexed as the touch electrodes, for example, through time-multiplexing technology. Thus, the display panel with the single-layer touch may have a simpler structure, and the touch function may be easier to be enabled in the display panel.

The display element 11 may be any appropriate type of display element, such as plasma display element, field emission display element, liquid crystal display (LCD) element, organic light emitting diode (OLED) display element, light emitting diode (LED) display element, quantum dots (QD) display element or other types of display element. In particular, the OLED display element may include a cathode layer, an anode layer, an organic light-emitting layer and a circuit layer. Because the OLED display element often requires the highest degree of protection from moisture and oxygen penetration in electronic devices, the disclosed display panel may be able to satisfy such a requirement.

It should be noted that, the OLED display element emits light under a current driving. If the OLED display element adopted as the display element 11 is configured to have a double-layer touch structure and, meanwhile, the display electrodes in the display element 11 are multiplexed as the touch electrodes, the touch voltage may shift when the display panel is switched from a display mode to a touch mode. Thus, the display current (i.e., the current for driving the OLED display element to emit light) may also shift, affecting the grey scale levels in the display element 11 and further degrading the image performance of the display panel.

However, in the disclosed embodiments, the display panel may be configured to have the single-layer touch structure, i.e., the touch electrode layer 13 and the touch signal lines may be disposed in a same layer, and the display electrodes in the display element 11 may not be configured to be multiplexed as the display electrodes. Thus, the image performance of the display panel may not be degraded in the touch mode.

Further, the inorganic film 12b may be disposed within a region of the first barrier layer 12 close to the display element 11, because the inorganic film 12b exhibits better moisture and oxygen barrier properties than the organic film 12a, which may enable the first barrier layer 12 to have the excellent moisture and oxygen barrier properties required by the display element 11. Thus, disposing the inorganic film 12b within the region of the first barrier layer 12 close to the display element 11 may protect the display element 11 from moisture and oxygen more efficiently.

The thickness of the organic film layer 12a, the inorganic film 12b and the first barrier layer 12 may be determined by predetermined algorithms. The predetermined algorithms may be designed according to various requirements of the moisture and oxygen barrier properties, flexibility, light transmittance, etc. Generally, a larger thickness of the organic film layer 12a, the inorganic film 12b and the first barrier layer 12 may lead to better moisture and oxygen barrier properties of the first barrier layer 12. However, in the practical manufacturing, the thickness of the encapsulation of the display element 11 having an impact on a thinner and lighter design of the display panel, as well as other technical issues affecting the manufacturing the display panel, may also have to be taken into account.

In one embodiment, the thickness of the organic film layer 12a and the inorganic film 12b may be approximately 500 nm-15000 nm, 300 nm-2000 nm, respectively. The overall thickness of the first barrier layer 12 may be approximately 1 μm-20 μm. The organic film layer 12a, the inorganic film 12b and the first barrier layer 12 with the above-mentioned thickness (i.e., 500 nm-15000 nm, 300 nm-2000 nm, 1 μm-20 μm) may exhibit excellent moisture and oxygen barrier properties, while not affect the thinner and lighter design, as well as the fabrication of the display panel.

Figure 2:
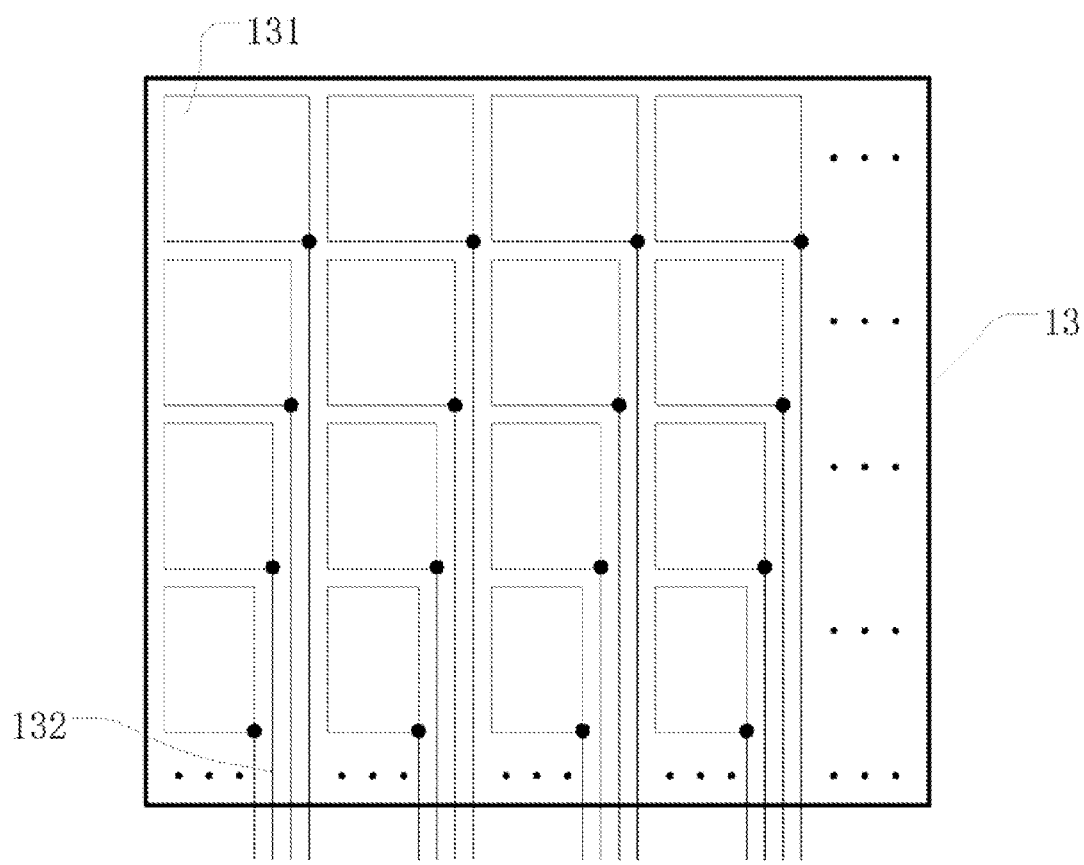
FIG. 2 illustrates a top view of an exemplary touch electrode layer in an exemplary display panel consistent with disclosed embodiments.

FIG. 2 illustrates a top view of an exemplary touch electrode layer in an exemplary display panel consistent with disclosed embodiments. As shown in FIG. 2, the touch electrode layer 13 may include a plurality of touch electrodes 131, and a plurality of touch signal lines 132 electrically connected to the touch electrodes 131. The touch electrodes 131 may detect touches based on the self-capacitance. The touch electrodes 131 may be arranged in a matrix, and the width of the touch electrode 131 in a row direction of the matrix may be gradually decreased row by row. Thus, the touch signal line 132 may be directly disposed in the gap between adjacent columns of the touch electrodes 131 (i.e., adjacent touch electrode columns), simplifying the fabrication process.

It should be noted that, the arrangement of the touch electrodes 131 shown in FIG. 2 is only for illustrating that the touch electrodes 131 may detect touches based on the self-capacitance, which is not intended to limit the scope of the present disclosure. Further, the touch electrode 131 may be in rectangular shape, rhombic shape, triangular shape, circular shape, or any irregular shape. The arrangement of the touch electrodes 131 as well as the shape of the touch electrodes 131 may vary according to various fabrication process and practical applications.

Figure 3:
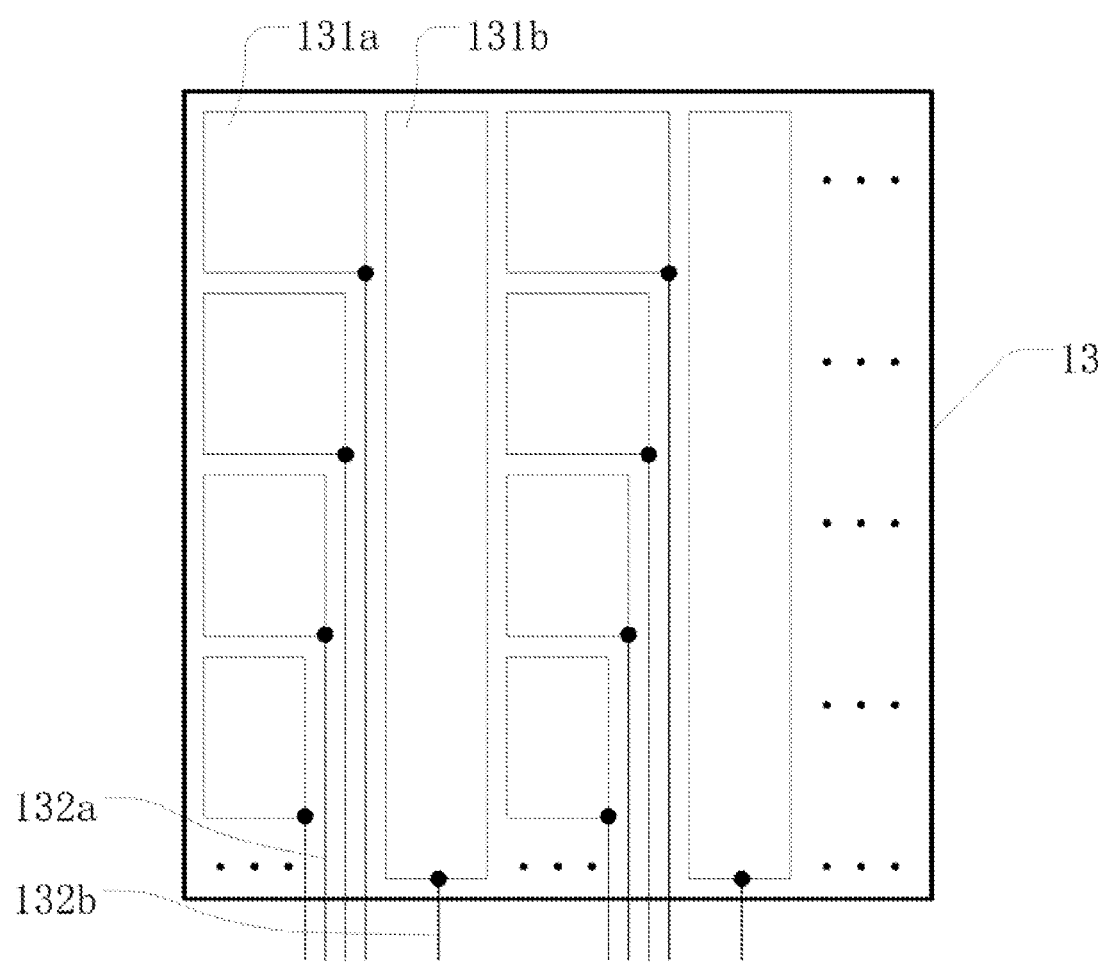
FIG. 3 illustrates a top view of another exemplary touch electrode layer in an exemplary display panel consistent with disclosed embodiments.

FIG. 3 illustrates a top view of another exemplary touch electrode layer in an exemplary display panel consistent with disclosed embodiments. As shown in FIG. 3, the touch electrode layer 13 may include a plurality of touch electrodes 131a and 131b, and a plurality of touch signal lines 132a and 132b. The touch electrodes 131a may be arranged in columns (i.e., forming touch electrode 131a columns). The touch electrodes 131b may be arranged in a row direction (e.g., a left-to-right direction in FIG. 3) and extend in a column direction (e.g., an up-to bottom direction in FIG. 3). The touch electrode 131a columns and the touch electrodes 131b may be alternately arranged along the row direction.

The touch signal lines 132a and the touch signal lines 132b may be electrically connected to the touch electrodes 131a and the touch electrodes 131b, respectively. The touch electrodes 131a and the touch electrodes 131b may detect touches based on the mutual-capacitance. In one embodiment, the touch electrodes 131a and the touch electrodes 131b may be configured to be driving electrodes and sensing electrodes, respectively. Meanwhile, the touch signal lines 132a and the touch signal lines 132b may be configured to be driving signal lines and sensing signal lines, respectively. The driving electrodes 131a and the adjacent sensing electrodes 131b may generate the mutual-capacitance.

It should be noted that, the arrangement of the touch electrodes 131a and 131b shown in FIG. 3 is only for illustrating that the touch electrodes 131a and 131b may detect touches based on the mutual-capacitance, which is not intended to limit the scope of the present disclosure. Further, the touch electrodes 131a and 131b may be in rectangular shape, rhombic shape, triangular shape, circular shape, or any irregular shape. The arrangement of the touch electrodes 131a and 131b, as well as the shape of the touch electrodes 131a and 131b may vary according to various fabrication process and practical applications.

Figure 4:
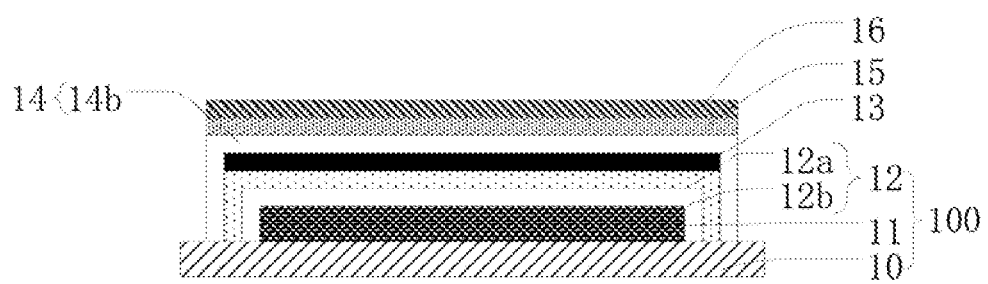
FIG. 4 illustrates a cross-sectional view of an exemplary display device consistent with disclosed embodiments.

The present disclosure also provides an improved display device including the disclosed display panel. FIG. 4 illustrates a cross-sectional view of an exemplary display device consistent with disclosed embodiments. The display device may include any one of the disclosed display panel. For example, the display device may be a smartphone, a tablet, a wearable device, etc., which is capable of displaying images and/or videos. Further, the display device may be any electronic device or any electronic component capable of displaying images and/or videos and including any one of the disclosed display panel.

As shown in FIG. 4, the display device may include a display panel 100, a second barrier layer 14 disposed on the display panel 100, a polarizer 15 and a cover glass 16. The polarizer 15 may be disposed on the second barrier layer 14, and configured to enhance the contrast ratio of the display panel 100 and reduce the surface reflection of the display panel 100. The cover glass 16 may be disclosed on the polarizer 15, protecting the polarizer 15 and the display panel 100.

The display panel 100 may have a similar structure as the display panel shown in FIG. 1. As shown in FIG. 4, the display panel 100 may further include a substrate 10, a display element 11, a first barrier layer 12, a touch electrode layer 13, and a plurality of touch signal lines (not drawn in FIG. 4). In particular, the display element 11 may be disposed on the substrate 10, the touch electrode layer 13 and the touch signal lines may be disposed in a same layer, and the first barrier layer 12 may be disposed between the touch electrode layer 13 (touch signal lines) and the display element 11. The first barrier layer 12 may include at least one organic film 12a and at least one inorganic film 12b, in which the organic film 12a and the inorganic film 12b may be alternately arranged.

The display element 11 often requires a protection from moisture and oxygen penetration in electronic device, otherwise the performance, stability and durability of the display element 11 may be affected. In the disclosed embodiments, the display element 11 may be encapsulated by the first barrier layer 12, in which the organic film 12a and the inorganic film 12b may be alternately arranged. Such a thin-film-encapsulation (TFE) may exhibit a simple structure, low moisture and oxygen permeability.

Inorganic films often have excellent moisture and oxygen barrier properties, but are substantially rigid. Organic films have poorer moisture and oxygen barrier properties than inorganic films, but are able to eliminate the stress generated by inorganic film. Thus, alternately arranging the organic film 12a and the inorganic film 12b may provide excellent moisture and oxygen barrier properties in the first barrier layer 12 and, meanwhile, minimize the stress of the first barrier layer 12. Accordingly, the display element 11 may be less affected by the moisture, oxygen, stress, etc.

The numbers of layers of the organic films 12a and the inorganic films 12b in the first barrier layer 12 may be determined by predetermined algorithms. The predetermined algorithms may be designed according to various requirements of the moisture and oxygen barrier properties, flexibility, light transmittance, etc. In one embodiment, as shown in FIG. 4, the first barrier layer 12 may include one organic film 12a and one inorganic film 12b.

The touch electrode layer 13 may include a plurality of touch electrodes, and may have a single-layer touch structure, i.e., the touch electrode layer 13 and the touch signal lines may be disposed in a same layer. Compared to the display panel with the double-layer touch structure, via drillings for connecting the touch electrodes as well as connecting the touch electrodes and the touch signal lines may not be required in the display panel with the single-layer touch structure. Thus, each organic films and each inorganic film in the first barrier layer 12 may be tightly laminated without destroying the film integrity, which may successfully enable the touch function in the display panel but not affect the moisture and oxygen barrier properties of the first barrier layer 12.

In addition, compared to the display panel with the double-layer touch structure, the display panel with the single-layer touch structure may be thinner and lighter, and display electrodes in the display element 11 (i.e., electrodes used for displaying images) may not be multiplexed as the touch electrodes, for example, through time-multiplexing technology. Thus, the display panel with the single-layer touch may have a simpler structure, and the touch function may be easier to be enabled in the display panel.

Further, the display device may also include the second barrier layer 14 disposed on a surface of the touch electrode layer 13 (the touch signal lines) far away from the display element 11, such that the touch electrode layer 13 (the touch signal lines) may be sandwiched between the first barrier layer 12 and the second barrier layer 14. The second barrier layer 14 may not only protect the touch electrode layer 13 and the touch signal lines, and also further prevent the moisture and oxygen from penetrating the display element 11.

The second barrier layer 14 may include at least one inorganic film 14b, which may have excellent moisture and oxygen barrier properties, and enough ruggedness to protect the touch electrode lay 13. The numbers of layers of the inorganic film 14b in the second barrier layer 14, as well as the thickness of the inorganic film 14b may be determined by predetermined algorithms. The predetermined algorithms may be designed according to various requirements of the moisture and oxygen barrier properties, flexibility, light transmittance, etc.

In one embodiment, as shown in FIG. 4, the second barrier layer 14 may include one inorganic film 14b, which may form a thinner layer on the touch electrode layer 13 and enable better touch performance in the display device. The thickness of the second barrier layer 14 may be approximately 0.3 μm-20 μm. The second barrier layer 12 with the above-mentioned thickness (i.e., 0.3 μm-20 μm) may effectively isolate the moisture and oxygen, protect the touch electrode layer, while not affect the thinner and lighter design of the other layers above the touch electrode layer and the touch performance.

The display device may further include a flexible circuit board or a controlling chip (not drawn in FIG. 4), which may provide display signals and touch signals to the display panel 100. The display device may include a plurality of touch units or sensor units for touching functions, and a plurality of display units for displaying images. The touch units and the display units may share the flexible circuit board or the controlling chip, saving the space in the display device and lowering the cost of the display device.

It should be noted that, in the disclosed embodiments, the touch units and the display units may share the flexible circuit board or the controlling chip providing display signals and touch signals to the display panel 100, which is only for illustrative purposes, and is not intended to limit the scope of the present disclosure. In another embodiment, the touch units and the display units may have individual flexible circuit boards or individual controlling chips.

Figure 5:
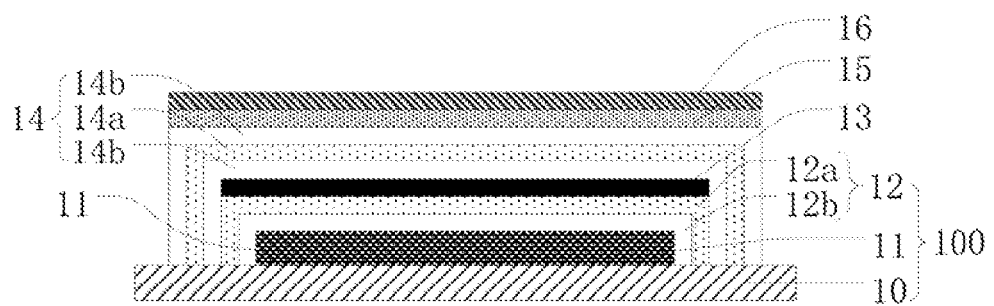
FIG. 5 illustrates a cross-sectional view of another exemplary display device consistent with disclosed embodiments.

FIG. 5 illustrates a cross-sectional view of another exemplary display device consistent with disclosed embodiments. The similarities between FIG. 4 and FIG. 5 are not repeated here, while certain difference may be illustrated. As shown in FIG. 5, the second barrier layer 14 may include at least one organic film 14a and at least one inorganic film 14b, in which the organic film 12a and the inorganic film 12b may be alternately arranged.

Generally, inorganic films often have excellent moisture and oxygen barrier properties, but are substantially rigid. Organic films have poorer moisture and oxygen barrier properties than inorganic films, but are able to eliminate the stress generated by inorganic film. Thus, alternately arranging the organic film 14a and the inorganic film 14b may provide excellent moisture and oxygen barrier properties in the second barrier layer 14 and, meanwhile, minimize the stress of the second barrier layer 14. Accordingly, the display element 11 may be less affected by the moisture, oxygen, stress, etc.

The numbers of layers of the organic films 14a and the inorganic films 14b in the second barrier layer 12 may be determined by predetermined algorithms. The predetermined algorithms may be designed according to various requirements of the moisture and oxygen barrier properties, flexibility, light transmittance, etc. In one embodiment, as shown in FIG. 5, the second barrier layer 14 may include one organic film 14a and two inorganic films 14b. In particular, the two inorganic films 14b may be disposed within the region of the second barrier layer 14 close to the display element 11 (i.e., close to the touch electrode layer 13) and the region of the second barrier layer 14 far away from the display element 11, respectively. That is, the organic film 14a may be sandwiched between the two inorganic films 14b.

The inorganic film 14b is substantially rigid, thus, disposing the inorganic film 14b disposed within the region of the second barrier layer 14 close to the display element 11 (i.e., close to the touch electrode layer 13) may well protect the touch electrode lay 13. On the other hand, moisture and oxygen may be most likely to permeate the display device from the region of the second barrier layer 14 far away from the display element 11, thus, disposing the inorganic film 14b within the region of the second barrier layer 14 far away from the display element 11 may protect the display element 11 from moisture and oxygen more efficiently.

In the disclosed display panels and display devices, the display element may be encapsulated by the first barrier layer, in which the organic film and the inorganic film 12b may be alternately arranged. Such an encapsulation may provide a simple structure, low moisture and oxygen permeability. Inorganic films often have excellent moisture and oxygen barrier properties, but are substantially rigid. Organic films have poorer moisture and oxygen barrier properties than inorganic films, but are able to eliminate the stress generated by inorganic film. Thus, alternately arranging the organic film and the inorganic film may provide excellent moisture and oxygen barrier properties in the first barrier layer and, meanwhile, minimize the stress of the first barrier layer. Accordingly, the display element may be less affected by the moisture, oxygen, stress, etc.

Compared to the display panel with the double-layer touch structure, via drillings for connecting the touch electrodes as well as connecting the touch electrodes and the touch signal lines may not be required in the display panel with the single-layer touch structure. Thus, each organic films and each inorganic film in the first barrier layer may be tightly laminated without destroying the film integrity, which may successfully enable the touch function in the display panel but not affect the moisture and oxygen barrier properties of the first barrier layer.

Further, compared to the display panel with the double-layer touch structure, the display panel with the single-layer touch structure may be thinner and lighter, and display electrodes in the display element may not be multiplexed as the touch electrodes, for example, through time-multiplexing technology. Thus, the display panel with the single-layer touch may have a simpler structure, and the touch function may be easier to be enabled in the display panel.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A display panel, comprising:
   a substrate;
   a display element, a touch electrode layer and a plurality of touch signal lines disposed on the substrate, wherein the touch electrode layer further includes a plurality of individually configured touch electrodes detecting a touch based on self-capacitance or mutual-capacitance, the touch electrode layer has a single-layer touch structure in which all the touch electrodes in the display panel used for detecting the touch on the display panel and the plurality of touch signal lines are disposed in a same single layer;
a first barrier layer disposed between the display element and the touch electrode layer and including at least one organic film and at least one inorganic film alternately arranged, and the touch electrode layer is disposed over, and in contact with, the at least one organic film;
a second barrier layer, wherein the touch electrode layer has a first surface facing the display element and an opposite surface, and the second barrier layer is disposed on the opposite surface of the touch electrode layer; and
a polarizer disposed over the second barrier layer, wherein:
the second barrier layer includes at least another organic film and at least two another inorganic films, the at least another organic film being sandwiched between the at least two another inorganic films,
the polarizer is disposed over, and in contact with, one of the at least two another inorganic films,
the display element comprises a plurality of display electrodes for displaying images, and all the display electrodes in the display panel used for displaying the images are not multiplexed as the plurality of touch electrodes in the touch electrode layer, and
the plurality of touch electrodes are one-to-one corresponding to the plurality of touch signal lines.

2. The display panel according to claim 1, wherein:
the display element is an organic light-emitting diode (OLED) display element.

3. The display panel according to claim 1, wherein:
the at least one inorganic film is disposed within a region of the first barrier layer close to the display element.

4. The display panel according to claim 1, wherein:
the organic film has a thickness of approximately 500 nm-15000 nm.

5. The display panel according to claim 1, wherein:
the inorganic film has a thickness of approximately 300 nm-2000 nm.

6. The display panel according to claim 1, wherein:
the first barrier layer has a thickness of approximately 1 µm-20 µm.

7. A display device, comprising:
a display panel, wherein the display panel comprises:
a substrate;
a display element, a touch electrode layer and a plurality of touch signal lines disposed on the substrate, wherein the touch electrode layer further includes a plurality of individually configured touch electrodes detecting a touch based on self-capacitance or mutual-capacitance, the touch electrode layer has a single-layer touch structure in which all the touch electrodes in the display panel used for detecting the touch on the display panel and the plurality of touch signal lines are disposed in a same single layer; and
a first barrier layer disposed between the display element and the touch electrode layer and including at least one organic film and at least one inorganic film alternately arranged, and the touch electrode layer is disposed over, and in contact with, the at least one organic film;
a second barrier layer, wherein the touch electrode layer has a first surface facing the display element and an opposite surface, and the second barrier layer is disposed on the opposite surface of the touch electrode layer; and
a polarizer disposed over the second barrier layer, wherein:
the second barrier layer includes at least another organic film and at least two another inorganic films, the at least another organic film being sandwiched between the at least two another inorganic films,
the polarizer is disposed over, and in contact with, one of the at least two another inorganic films,
the display element comprises a plurality of display electrodes for displaying images, and all the display electrodes in the display panel used for displaying the images are not multiplexed as the plurality of touch electrodes in the touch electrode layer, and
the plurality of touch electrodes are one-to-one corresponding to the plurality of touch signal lines.

8. The display device according to claim 7, wherein:
the display element is an organic light-emitting diode (OLED) display element.

9. The display device according to claim 7, wherein:
the at least one inorganic film is disposed within a region of the first barrier layer close to the display element.

10. The display device according to claim 7, wherein:
the organic film has a thickness of approximately 500 nm-15000 nm.

11. The display device according to claim 7, wherein:
the inorganic film has a thickness of approximately 300 nm-2000 nm.

12. The display device according to claim 7, wherein:
the first barrier layer has a thickness of approximately 1 µm-20 µm.

13. The display device according to claim 7, wherein:
the second barrier layer includes the at least another organic film and one of the at least two another inorganic films alternately arranged.

14. The display device according to claim 13, wherein:
the second barrier layer has a first side facing the display element and an opposing side, and
the at least two another inorganic films are disposed on the first side and the opposite side of the second barrier layer.

15. The display device according to claim 7, wherein:
the second barrier layer has a thickness of approximately 0.3 µm-20 µm.

16. The display device according to claim 7, further including:
a flexible printed circuit board or a controlling chip providing display signals and touch signals to the display panel.

17. The display panel according to claim 1, wherein:
the display panel has an in-cell touch structure.

18. The display panel according to claim 1, wherein:
the touch electrodes are arranged in a matrix, and a width of the touch electrode in a row direction of the matrix are gradually decreased row by row; and
the touch signal lines are directly disposed in a gap between adjacent columns of the touch electrodes.

19. The display panel according to claim 1, wherein:
the plurality of individually configured touch electrodes includes a plurality of first touch electrodes and a plurality of second touch electrodes,
the plurality of first touch electrodes is arranged along a column direction, the plurality of second touch electrodes, extending along the column direction, is arranged along a row direction, the row direction intersecting with the column direction, and columns of the plurality of first touch electrodes and the plurality of second touch electrodes, are alternatively arranged along the row direction.

\* \* \* \* \*